United States Patent
Lim

(10) Patent No.: US 7,211,460 B2
(45) Date of Patent: May 1, 2007

(54) METHODS FOR EXPOSING DEVICE FEATURES ON A SEMICONDUCTOR DEVICE

(75) Inventor: Taek-jin Lim, Gyeonggi-do (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 10/960,660

(22) Filed: Oct. 7, 2004

(65) Prior Publication Data

US 2005/0079689 A1   Apr. 14, 2005

(30) Foreign Application Priority Data

Oct. 13, 2003   (KR) ...................... 10-2003-0070974

(51) Int. Cl.
*H01L 21/00* (2006.01)
(52) U.S. Cl. .................. 438/62; 438/800; 438/975
(58) Field of Classification Search .................. 438/62, 438/401, 462, 700, 800, 975
See application file for complete search history.

(56) References Cited

U.S. PATENT DOCUMENTS 5,847,468 A * 12/1998 Nomura et al. ............. 257/797
6,015,744 A *  1/2000 Tseng ........................ 438/401
6,902,986 B2 *  6/2005 Maltabes et al. ........... 438/401

FOREIGN PATENT DOCUMENTS

| JP | 2001-15570 | 1/2001 |
|---|---|---|
| JP | 2003-203959 | 7/2003 |
| KR | 178019 | 7/1991 |
| KR | 1020030029402 | 4/2003 |

OTHER PUBLICATIONS

Notice to Submit a Response for Korean patent application No. 10-2003-0070974 mailed on Oct. 25, 2005.

* cited by examiner

*Primary Examiner*—Phuc T. Dang
(74) *Attorney, Agent, or Firm*—Myers Bigel Sibley & Sajovec, PA

(57) ABSTRACT

A semiconductor device includes alignment marks that are aligned with device features. The semiconductor device includes a device feature, a pair of first alignment marks, a pair of second alignment marks, and a pair of third alignment marks. The first alignment marks are aligned along a first direction with the device feature and adjacent to opposite sides of the device feature. The second alignment marks are aligned along a second direction with the device feature that is substantially perpendicular to the first direction, and adjacent to opposite sides of the device feature. The third alignment marks are aligned with the first alignment marks in the first direction and adjacent to opposite sides of the device feature, wherein the third marks are between the first alignment marks and the device feature, and each of the third marks have a shorter length along the first direction than each of the first alignment marks.

8 Claims, 5 Drawing Sheets

METHODS FOR EXPOSING DEVICE FEATURES ON A SEMICONDUCTOR DEVICE

RELATED APPLICATION

This application claims priority under 35 U.S.C. § 119 to Korean Patent Application No. 10-2003-0070974, filed on Oct. 13, 2003, in the Korean Intellectual Property Office, the disclosure of which is herein incorporated by reference in its entirety.

FIELD OF THE INVENTION

The present invention relates to analysis of semiconductor devices, and more particularly, to semiconductor devices having alignment marks and related methods.

BACKGROUND OF THE INVENTION

Semiconductor memory devices generally include arrays of cells that form memory units. Each of the cells can include a transistor pattern having a gate and source/drain regions. To obtain ever higher integration density in the memory devices, gate lengths and intervals between gates are continuing to be reduced. For example, in some memory-devices the source/drain regions can have a width of less than several tens of nanometers.

The small size of some transistor patterns may cause them to be difficult to observe with an optical microscope. Consequently, it can be difficult to detect and identify a particular failed cell in a memory device. For example, it may not be feasible to optically count numerous small cells in a memory device in an attempt to determine an address of a failed cell. Moreover, when a cell region has failed because of a doping abnormality, such a failure may be difficult to optically observe because the region may appear optically identical to other normal regions.

One approach to analyzing memory cells or other device features is to expose a vertical profile of a cell that is to be analyzed. For example, it can be desirable to obtain a vertical profile of a failed cell address in a memory device by grinding a side face of the memory device to expose regions of the failed cell address. However, it may not be feasibly to optically identify a failed cell address with the memory device, and then to expose regions of that particular cell address so that they may be further analyzed.

A cell region can be inspected with a scanning microscope (SCM). A SCM can include a capacitance sensor and a probe. The capacitance sensor is electrically connected to the probe for measuring a capacitance between the probe and the cell region. The probe and cell region may, for example, have nanometer feature sizes. The capacitance sensor includes a high-frequency oscillator and an electrical resonator. The capacitance, which can have a very low value, is measured by varying a resonance frequency that is based on the capacitance. For example, a high frequency measured signal can be modulated onto a low frequency signal. A differential value of the capacitance relative to a voltage may be measured using a lock-in amplifier. The SCM can measure carrier concentrations and second dimensional doping profiles of the cell regions.

Accordingly, if a failed cell region can be exposed for analysis by a SCM, the doping profiles measured by the SCM may provide an answer as to why the cell region failed.

SUMMARY OF THE INVENTION

According to some embodiments of the present invention, a semiconductor device includes alignment marks that are aligned with device features. The semiconductor device includes a device feature, a pair of first alignment marks, a pair of second alignment marks, and a pair of third alignment marks. The first alignment marks are aligned along a first direction with the device feature and adjacent to opposite sides of the device feature. The second alignment marks are aligned along a second direction with the device feature that is substantially perpendicular to the first direction, and adjacent to opposite sides of the device feature. The third alignment marks are aligned with the first alignment marks in the first direction and adjacent to opposite sides of the device feature, wherein the third marks are between the first alignment marks and the device feature, and each of the third marks have a shorter length along the first direction than each of the first alignment marks.

According to further embodiments of the present invention, one of the second alignment marks may be on the device feature. The third alignment marks may be trenches in the semiconductor device. A pair of trench type fourth alignment marks may be directly connected to the first alignment marks and aligned therewith. The first alignment marks may be between the fourth alignment marks and the device feature.

According to still further embodiments of the present invention, a first auxiliary alignment mark may be aligned with the second alignment marks and the device feature along the second direction. One of the second alignment marks may be between the first auxiliary alignment mark and the device feature. The first auxiliary alignment mark may have a variable cross-section width along the first direction.

According to still further embodiments of the present invention, a side face of the semiconductor device is ground in the second direction to substantially simultaneously expose the first alignment marks, the second alignment mark on the device feature, and the third alignment marks. An amount of the side face of the semiconductor device that is to be removed by grinding to expose the first alignment marks, the second alignment mark on the device feature, and the third alignment marks may be estimated based on the cross-section width of the first auxiliary alignment mark along the first direction. A rate of grinding of the side face of the semiconductor device may be reduced based on the cross-section width of the first auxiliary alignment mark along the first direction. A rate of grinding of the side face of the semiconductor device may be reduced based on exposure of a first one of the pair of second alignment marks. A rate of grinding of the side face of the semiconductor device may be reduced based on exposure of the third marks. The grinding of the side face of the semiconductor device may be stopped based on exposure of the second alignment mark on the device feature.

Some other embodiments of the present invention provide a method for exposing at least a portion of a defective device feature on a semiconductor device. A plurality of alignment marks are formed on the semiconductor device. Portions of the semiconductor device are ground away to expose the defective device feature. The rate of grinding is varied based on the alignment marks.

DETAILED DESCRIPTION

Figure 1:
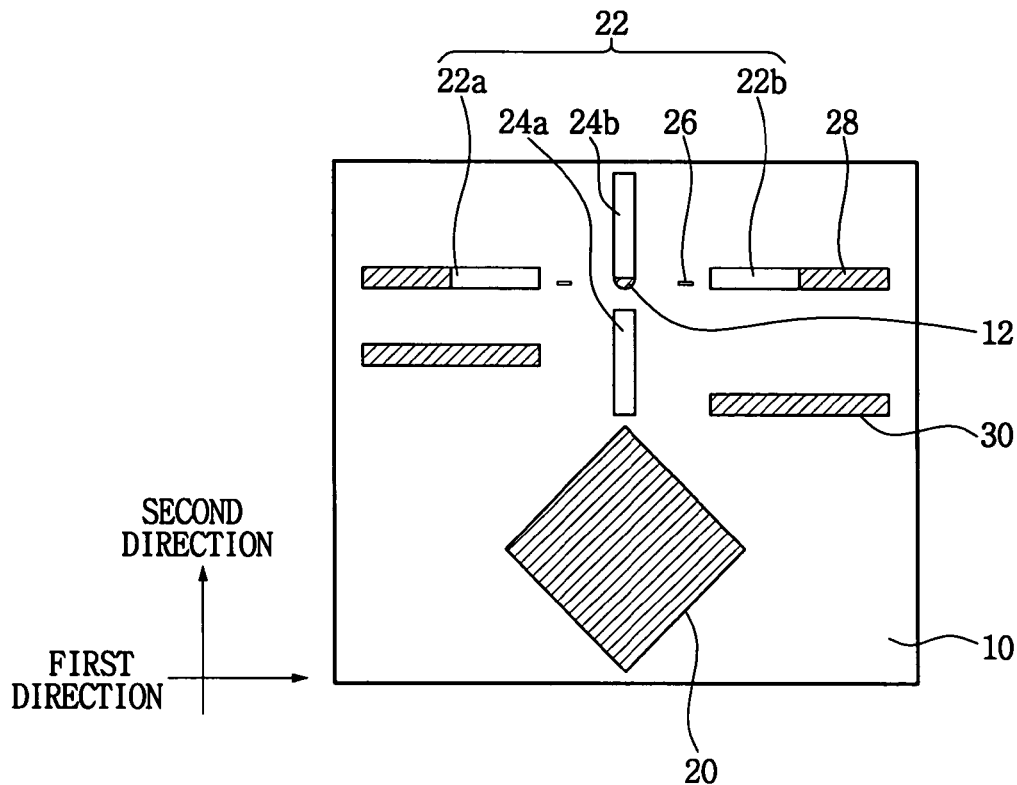
FIG. 1 is a plan view of alignment marks adjacent to a semiconductor device feature in accordance with various embodiment of the present invention.

Certain embodiments of the present invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to, for example, the particular shapes of regions illustrated herein, but are to include deviations in shapes that result, for example, from manufacturing. For example, an implanted, deposited, and/or etched region illustrated as a rectangle will, typically, have rounded or curved features at its edges. Thus, the regions illustrated in the figures are schematic in nature and their shapes are not intended to illustrate the precise shape of a region of a device and are not intended to limit the scope of the present invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view of alignment marks that are adjacent to a device feature in accordance with various embodiments of the present invention. The device feature may be, for example, a failed memory cell or region therein. The alignment marks may be used to obtain a vertical profile of the device feature as will also be described later herein.

Referring to FIG. 1, a plan view is provided of a semiconductor device 10 on which device features may be formed. One such device feature 12 is illustrated. The semiconductor device 10 may, for example, be a memory device in which the device feature 12 is a failed memory cell or region (e.g., a failed memory address). Alignment marks 20, 22, 24, 26, 28, and 30 are formed on the semiconductor device 10 adjacent to the device feature 12, in accordance with various embodiments of the present invention. The alignment marks may be used to assist with locating the device feature 12 and obtaining a vertical profile thereof, such as by grinding the semiconductor device 10, as will be described later herein.

For purposes of illustration only, the orientation and use of the alignment marks 20, 22, 24, 26, 28, and 30 will be described in the content of grinding a side face of the semiconductor device 10, which is parallel to the illustrated first direction, to remove material therefrom along the second direction and to expose a vertical profile of the device feature 12, in accordance with some embodiments of the present invention. The first direction is substantially perpendicular to the second direction.

A first auxiliary alignment mark 20 is provided on the semiconductor device 10 aligned with the device feature 12 along the second direction, and between the face that is to be ground and the device feature 12. The first auxiliary alignment mark 20 may be used to determine the proximity between the side face of the semiconductor device 10 as it is grinded and the device feature 12. The first auxiliary alignment mark 20 may be formed as a trench in the semiconductor device 10. The first auxiliary alignment mark 20 may also have a variable cross-section width along the first direction, such as a lozenge shape, a triangular shape, and/or a circular shape. Accordingly, the proximity to the side face of the semiconductor device 10 and the device feature 12 may be determined based on an cross-section width of the first auxiliary alignment mark 20 that is exposed by grinding. The rate of grinding of the side face of the semiconductor device 10 may then be controlled, and may be reduced, based on the cross-section width of the first auxiliary alignment mark 20.

In certain embodiments of the present invention, the first auxiliary alignment mark 20 may have a length of about 10 µm to about 100 µm in the first and second directions, respectively. The first auxiliary alignment mark 20 may be spaced apart from the device feature 12 to provide a region on which other alignment marks may be formed.

A pair of first alignment marks 22a and 22b, referred to collectively as 22, are aligned with the device feature 12 along the first direction adjacent to opposite sides of the device feature 12. The first alignment marks 22a and 22b may include metal, and/or they may have a length of about 1 μm to about 5 μm in the first direction and a length of about 0.5 μm to about 2 μm in the second direction.

A pair of second alignment marks 24a and 24b are aligned with the device feature 12 along the second direction, and are adjacent to opposite sides of the device feature 12. The second alignment marks 24a and 24b may include a metal such as platinum. The second alignment mark 24a is disposed between the device feature 12 and the first auxiliary alignment mark 20 so that the proximity between the exposed side face of the semiconductor device 10 and the device feature 12 may be determined based on the second alignment mark 24a. Accordingly, the rate of grinding of the side face of the semiconductor device 10 may then be reduced based on exposure of the second alignment mark 24a.

The second alignment mark 24b is disposed behind the device feature 12 as viewed from the exposed side face of the semiconductor device 10, and may contact and be on (e.g., overlap) the device feature 12. The location of the device feature 12 along the first and second directions may thereby be determined based on the second alignment mark 24b. During a grinding process, grinding of the side face of the semiconductor device 10 may then be stopped based on exposure of the second alignment mark 24b. When the second alignment mark 24b becomes exposed, the side face of the semiconductor device 10 can include a vertical profile of the device feature 12.

In certain embodiments of the present invention, each of the second alignment marks 24a and 24b may have a length of about 0.1 μm to about 1 μm in the first direction and a length of about 0.5 μm to about 2 μm in the second direction.

As shown in FIG. 1, a pair of third alignment marks 26 may be aligned with the first alignment marks 22a and 22b in the first direction and adjacent to opposite sides of the device feature 12. The third alignment marks 26 may be between the first alignment marks 22a and 22b and the device feature 12, and each of the third alignment marks 26 may have a shorter length along the first direction than each of the first alignment marks 22a and 22b.

The third alignment marks 26 may comprise a trench in the semiconductor device 10. The third alignment marks 26 may be used to determine the location of the device feature 12 in the second direction. The rate of grinding of the side face of the semiconductor device 10 may then be reduced based on exposure of the third alignment marks 26.

The third alignment marks 26 may have a length in the second direction of about 0.5 times to about 1.5 times a length of the device feature 12 in the second direction. For example, the third marks 26 may have a length of about 0.5 μm to about 2 μm in the first direction and a length of about 50 nm to about 200 nm in the second direction.

A pair of fourth alignment marks 28 are on the semiconductor device 10 and directly connected to the first alignment marks 22a and 22b and aligned therewith. The first alignment marks 22a and 22b are between the fourth alignment marks and the device feature 12. The fourth alignment marks 28 may be used to determine whether the semiconductor device 10 is ground horizontally, such as by whether the fourth alignment marks 28 and the first alignment marks 22a and 22b are simultaneously exposed during a grinding process.

A pair of second auxiliary alignment marks 30 are formed as trenches in the semiconductor device 10, and are offset from each other along the second direction, and are adjacent to opposite sides of the second alignment mark 24a. The second auxiliary alignment marks 30 may be used to determine a proximity of the side face of the semiconductor device 10 relative to the device feature 12 during a grinding process.

Further methods of forming the alignment marks are now discussed below.

The semiconductor device 10 with the device feature 12 may be initially modified so that the device feature 10 is nearly centered thereon. The semiconductor device 10, may, for example, have first and second lengths of about 3 mm to about 10 mm in the first and second directions, respectively.

The semiconductor device 10 may be loaded into a focus ion beam (FIB) apparatus. Because the FIB apparatus can have a higher magnification than an optical microscope, the FIB apparatus may be used to count cell addresses based on recognition of surface features of the semiconductor device 10. Additionally, the semiconductor device 10 may be partially etched and/or a layer may be partially formed on the semiconductor device 10 using the FIB apparatus to form some of the alignment marks on the semiconductor device 10.

The first alignment marks 22a and 22b may be formed by depositing a metal, such as platinum, aligned with the device feature 12 along the first direction, and on opposite sides of the device feature 12. The first alignment marks 22a and 22b may have a length of about 1 μm to about 5 μm in the first direction and a length of about 0.5 μm to about 2 μm in the second direction. By forming the first alignment marks 22a and 22b by a deposition process, the first alignment marks 22a and 22b can have a sufficient size so as to be optically observable, in contrast to such marks that may be formed by an etching process. Accordingly, a position of the device feature 12 in the second direction may be determined by optical recognition of the first alignment marks 22a and 22b.

The pair of second alignment marks 24a and 24b may be formed by depositing a metal, such as platinum, on the semiconductor device 10, aligned with the device feature 12 along the second direction, and adjacent to opposite sides of the device feature 12. The second alignment mark 24b make be formed on a portion of the device feature 12, and to overlap and/or contact the device feature. Accordingly, the position of the device feature 12 in the first direction may be determined based on the second alignment mark 24b. The second alignment marks 24a and 24b may have a length of about 0.1 μm to about 1 μm in the first direction and a length of about 0.5 μm to about 2 μm in the second direction. Because the second alignment marks 24a and 24b may be formed by a deposition process, they may be more readily observed by an optical process compared to if they were formed by an etching process. Additionally, although the second alignment mark 24b may overlap the device feature 12, the vertical profile of the device feature 12 may not be affected thereby.

The semiconductor device 10 may be partially etched in the first direction between the first alignment marks 22a and 22b and the device feature 12 to form the third alignment marks 26 as trenches. The etching process may be carried out using a gallium ion in the FIB apparatus. The device feature 12 may not be damaged by the etching process. The third alignment marks 26 can be used to determine a position of the device feature 12 in the second direction. A thickness of each of the third alignment marks 26 may be about 0.5 times to about 1.5 times that of the device feature 12 in the second direction. In particular, the third alignment marks 26 may have a length of about 0.5 µm to about 2 µm in the first direction and the length of about 50 nm to about 200 nm in the second direction. The third alignment marks 26 may thereby be observable using the optical microscope.

The semiconductor device 10 may be partially etched along outer ends of the first alignment marks 22a and 22b to form the fourth alignment marks 28 as trenches. The fourth alignment marks 28 may thereby contact outer ends of the first alignment marks 22a and 22b. The fourth alignment marks 28 may be used to determine whether the semiconductor device 10 is ground horizontally (i.e., in parallel). For example, the semiconductor device 10 may be determined to be ground horizontally when the first alignment marks 22a and 22b and the fourth alignment marks 28 are simultaneously exposed during the grinding process.

The semiconductor device 10 may also be partially etched to form the first auxiliary alignment mark 20. The first auxiliary alignment mark 20 may be used to determine a proximity of the side face of the semiconductor device 10 that is exposed during the grinding process and the device feature 12. The cross-section width of the first auxiliary alignment mark 20 varies based on distance from the exposed side face of the first auxiliary alignment mark 20 from the device feature 12. The first auxiliary alignment mark 20 may, for example, have a lozenge shape, a triangular shape, and/or a circular shape.

The semiconductor device 10 may be partially etched to form the second auxiliary alignment marks 30 as trenches. The second auxiliary alignment marks 30 can be offset relative to each other along the second direction and adjacent to opposite sides of the second alignment mark 24a. The second auxiliary alignment marks 30 may be used to determine the proximity of the side face of the semiconductor device 10 that is exposed during grinding to the device feature 12. For example, such proximity may be determined based on the observed position of the exposed second auxiliary alignment marks 30 and the second alignment mark 24a. Accordingly, the rate of grinding of the side face of the semiconductor device 10 may be reduced based on exposure of the second alignment mark 24a and/or based on exposure of one or both of the second auxiliary alignment marks 30.

As will be appreciated by one who is skilled in the art in light of the present disclosure, alignment marks may be oriented differently relative to a device feature and may be formed by various other processes according to yet other embodiments The alignment marks may thereby be used to assist with obtaining a vertical profile of the device feature 12, and will now be discussed for purposes of further illustration. The vertical profile may be used to analyze, for example, an abnormality in a process for doping impurities into source/drain regions, or other regions in the semiconductor device 10. The vertical profile may allow analysis that would not otherwise be possible through examination of the surface of a semiconductor device. To obtain a vertical profile of the device feature 12, a side face of the semiconductor device 10 is ground to expose the device feature 12.

FIGS. 2 to 6 are cross sectional views that illustrate methods for fabricating a device that is used for analyzing the vertical profile of a device feature in accordance with various embodiment of the present invention. FIGS. 7A to 7C are plan views illustrating a device that is subsequently ground.

Figure 2:
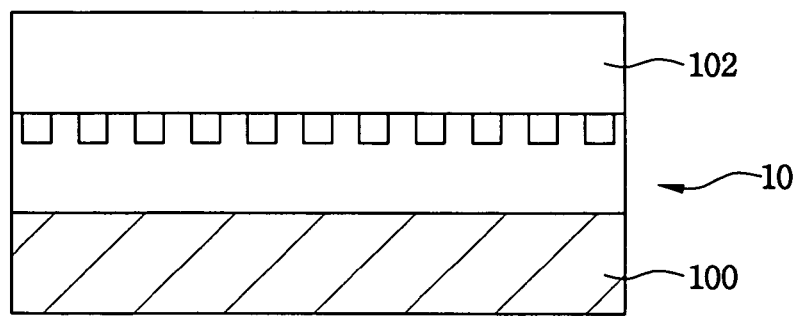
FIGS. 2 to 6 are cross sectional views that illustrate methods for forming alignment marks adjacent to a semiconductor device feature, and for grinding the semiconductor device to expose a surface of the device feature in accordance with various embodiments of the present invention.

Referring to FIG. 2, a glass layer 102 is deposited or attached on an upper face of the semiconductor device 10. The glass layer 102 may protect the semiconductor device 10 during a subsequent grinding process. At least one dummy substrate 100 may be attached on a lower face of the semiconductor device 10. The dummy substrate 100 may be used to adjust the thickness of the semiconductor device 10 during the grinding process.

Figure 3A:
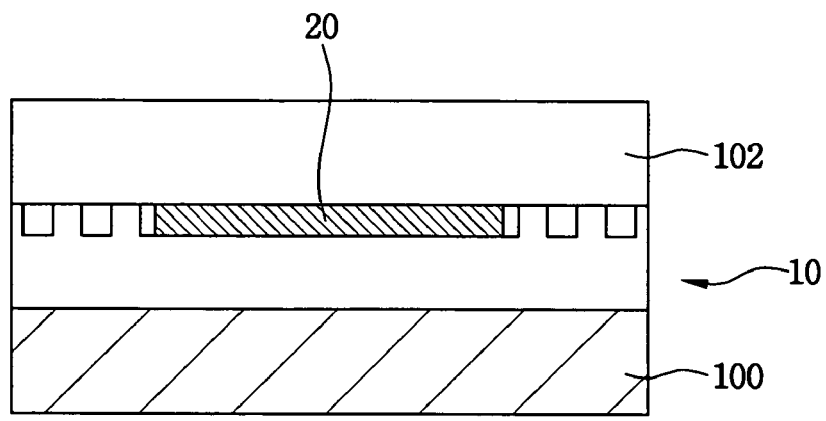
Figure 3B:
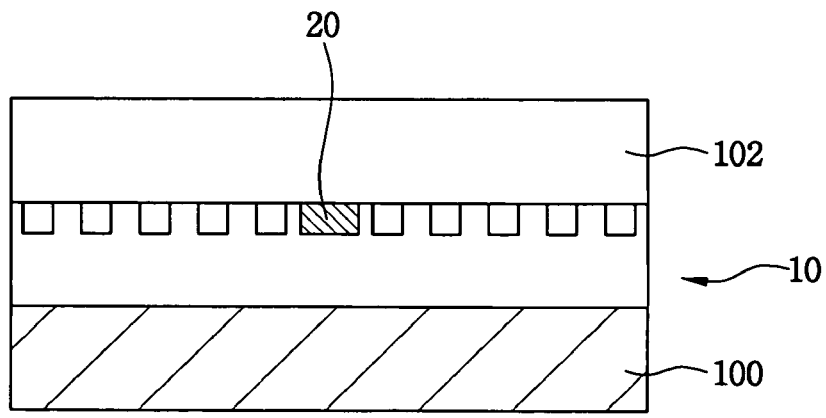

Referring to FIGS. 3A and 3B, a side face of the semiconductor device 10 is first ground in the second direction (see FIG. 1) to remove the first auxiliary alignment mark 20. In particular, the side face of the semiconductor device 10 may be continuously observed with an optical microscope during the grinding process. When the first auxiliary alignment mark 20 has a lozenge shape, the first auxiliary alignment mark 20 observed with the optical microscope in an initial stage of the primary grinding process has a very small cross-section width. When the first grinding process advances to a middle stage, as shown in FIG. 3A, the first auxiliary alignment mark 20 observed with the optical microscope has relatively larger cross-section width. When the first grinding process advances to a final stage, as shown in FIG. 3B, the first auxiliary alignment mark 20 observed with the optical microscope has a relatively small cross-section width, and may eventually not be observed through the optical microscope. FIG. 7A is a plan view illustrating the first ground semiconductor device 10.

Figure 4A:
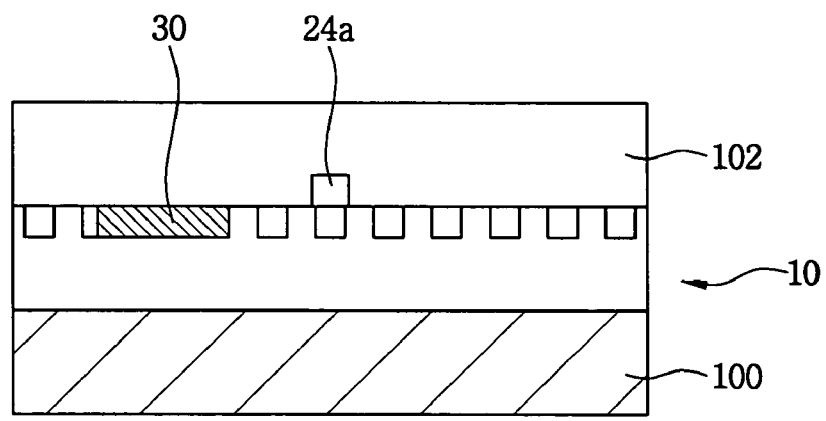
Figure 4B:
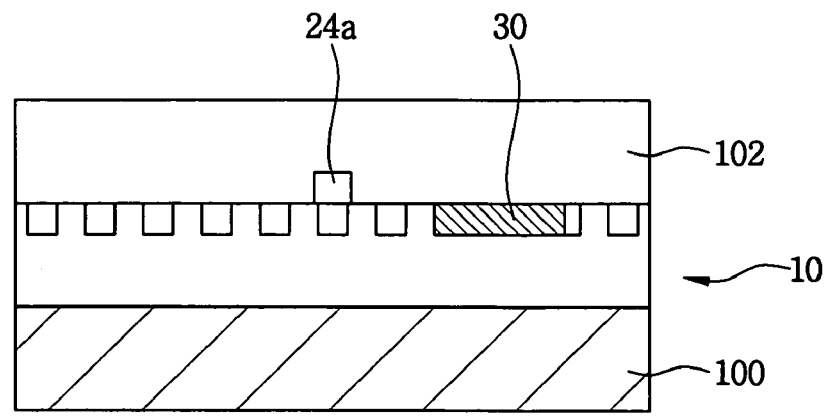

Referring to FIGS. 4A and 4B, the semiconductor device 10 may then be second ground in the second direction to remove the second alignment mark 24a. During the grinding process, the second alignment mark 24a is exposed through the side face of the semiconductor device 10. As shown in FIG. 4B, the illustrated right second auxiliary alignment mark 30 is also simultaneously exposed. As the second grinding process advances, the right second auxiliary alignment mark 30 disappears and, subsequently, the left second auxiliary alignment mark 30 becomes exposed, as shown in FIG. 4A.

Here, as described above, the second auxiliary alignment marks 30 are offset relative to each other along the second direction. Accordingly, the proximity between the exposed side face of the semiconductor device 10 and the device feature 12 may be determined based on exposure of the right and then left second auxiliary alignment marks 30. When the left second auxiliary alignment mark 30 is exposed, it is noted that the exposed side face of the semiconductor device 10 has closely approached the device feature 12. Accordingly, a rate at which the side face of the semiconductor device 10 is ground toward the device feature 12 may be reduced. FIG. 7B is a plan view illustrating the semiconductor device 10 after the second grinding process is completed.

Figure 5:
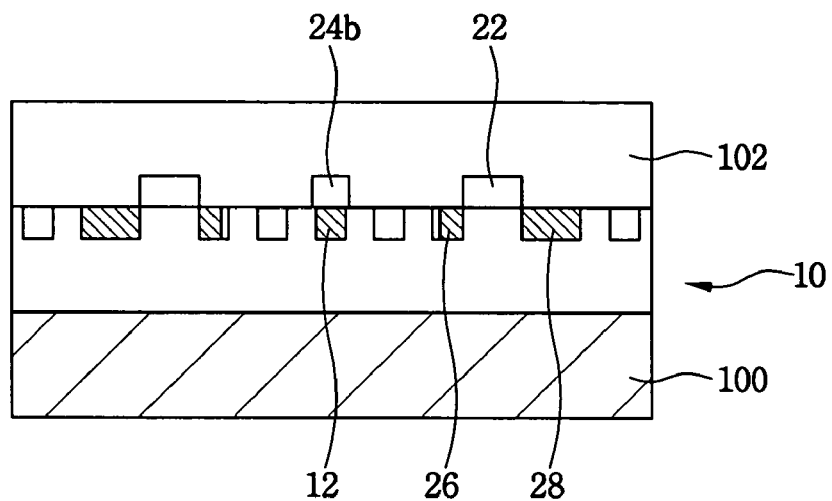

Referring to FIG. 5, the semiconductor device 10 is subject to a third grinding process to expose the first and fourth alignment marks 22 and 28. Because the third grinding process is performed at a stage where the exposed side face of the semiconductor device 10 is nearly adjacent to the device feature 12, the grinding process may have a very slow speed. Also, the exposed side face of the semiconductor device 10 may be frequently observed to prevent the device feature 12 from being ground. The grinding of the exposed side face of the semiconductor device 10 may be controlled so as to be horizontally ground by observing with the optical microscope that the first and fourth alignment marks 22 and 28 are parallel.

When the third grinding process is completed, the semiconductor device 10 has a side face that exposes the device feature 12. This vertical profile of the device feature 12 may then be further analyzed. For example, the vertical profile may be analyzed to determine a doping profile of the impurities in the device feature 12, and/or a doping depth, such as of a gate in a transistor, may be analyzed in the device feature 12.

The second alignment mark 24b that is behind the device feature 12 is exposed through the side face of the semiconductor device 10 when the device feature 12 is exposed. The first alignment marks 22a and 22b, the third alignment marks 26 and the fourth alignment marks 28 are also exposed through the side face of the semiconductor device 10. Accordingly, the position of the device feature 12 on the side face of the semiconductor device 10 may be precisely determined using the second alignment mark 24b and the third alignment marks 26. FIG. 7C is a plan view illustrating the semiconductor device 10 after completion of the third grinding process.

Figure 6:
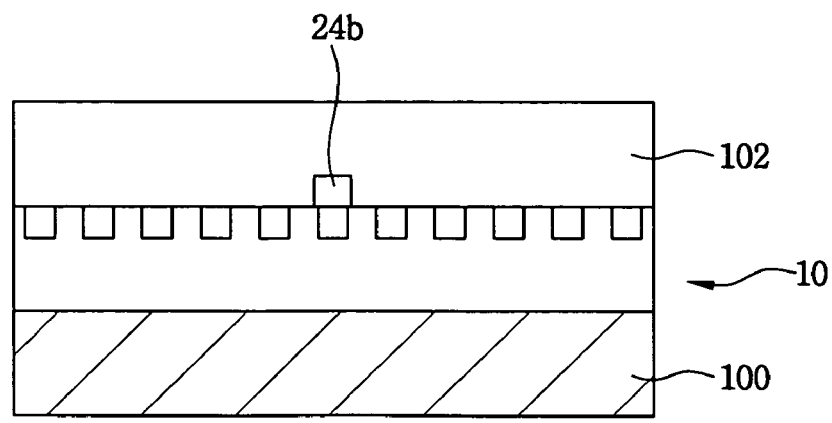
Figure 7A:
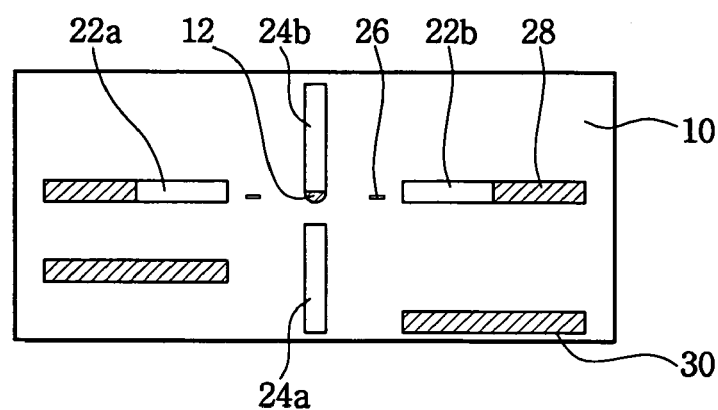
FIGS. 7A to 7C are sequential plan views of a semiconductor device that has been ground to expose a side surface of a device feature in accordance with various embodiments of the present invention.
Figure 7B:
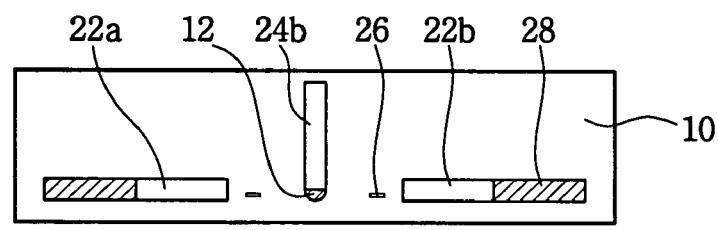
Figure 7C:
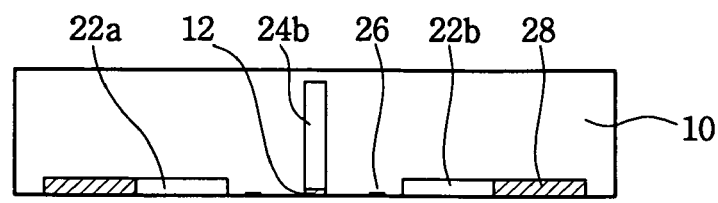

FIG. 6 is a cross sectional view that illustrates the semiconductor device 10 if the device feature 12 is removed. The device feature 12 may be removed by excessive grinding of the semiconductor device 10. However, by use of the alignment marks described herein, such excessive grinding may be avoided.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method for exposing at least a portion of a device feature on a semiconductor device, the method comprising:
    forming a plurality of alignment marks on the semiconductor device; and
    grinding away portions of the semiconductor device to expose the device feature, wherein the rate of grinding is varied based on exposure of at least some of the alignment marks, wherein:
    forming a plurality of alignment marks on the semiconductor device comprises:
        forming a pair of first alignment marks on the semiconductor device that are aligned along a first direction with the device feature and adjacent to opposite sides of the device feature;
        forming a pair of second alignment marks on the semiconductor device that are aligned along a second direction with the device feature, which is substantially perpendicular to the first direction, and adjacent to opposite sides of the device feature, wherein one of the second alignment marks is on the device feature; and
        forming a pair of third alignment marks on the semiconductor device that are aligned with the first alignment marks in the first direction and adjacent to opposite sides of the device feature, wherein the third marks are between the first alignment marks and the device feature, and each of the third marks have a shorter length along the first direction than each of the first alignment marks; and
    grinding away portions of the semiconductor device comprises grinding a side face of the semiconductor device in the second direction to substantially simultaneously expose the first alignment marks, the second alignment mark on the device feature, and the third alignment marks.

2. The method of claim 1, wherein grinding a side face of the semiconductor device comprises reducing a rate of grinding of the side face of the semiconductor device based on exposure of a first one of the pair of second alignment marks.

3. The method of claim 1, wherein the third marks are aligned with a side major surface of the first alignment marks, and wherein grinding a side face of the semiconductor device comprises reducing a rate of grinding of the side face of the semiconductor device based on exposure of the third marks.

4. The method of claim 1, wherein grinding a side face of the semiconductor device comprises stopping grinding of the side face of the semiconductor device based on exposure of the second alignment mark on the device feature.

5. The method of claim 1, further comprising:
    forming a first auxiliary alignment mark on the semiconductor device that is aligned with the second alignment marks and the device feature along the second direction, wherein one of the second alignment marks is between the first auxiliary alignment mark and the device feature, and wherein the first auxiliary alignment mark has a variable cross-section width along the second direction; and
    estimating an amount of the side face of the semiconductor device that is to be removed by grinding to expose the first alignment marks, the second alignment mark on the device feature, and the third alignment marks based on the cross-section width of the first auxiliary alignment mark along the first direction.

6. The method of claim 5, wherein grinding a side face of the semiconductor device comprises reducing a rate of grinding of the side face of the semiconductor device based on the cross-section width of the first auxiliary alignment mark along the first direction.

7. A method for exposing at least a portion of a device feature on a semiconductor device, the method comprising:
    forming a plurality of alignment marks on the semiconductor device;
    grinding away portions of the semiconductor device to expose the device feature, wherein the rate of grinding is varied based on exposure of at least some of the alignment marks; and
    attaching a glass layer to an upper major surface of the semiconductor device before grinding away portions of the semiconductor device to expose the device feature.

8. The method of claim 1, wherein forming a plurality of alignment marks on the semiconductor device comprises forming at least some of the alignment marks with a focus ion beam.

* * * * *